(12) United States Patent
Ono

(10) Patent No.: US 8,810,705 B2
(45) Date of Patent: Aug. 19, 2014

(54) SOLID-STATE IMAGE SENSING APPARATUS

(75) Inventor: Toshiaki Ono, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 13/523,511

(22) Filed: Jun. 14, 2012

(65) Prior Publication Data

US 2013/0016264 A1 Jan. 17, 2013

(30) Foreign Application Priority Data

Jul. 12, 2011 (JP) ................................. 2011-154265

(51) Int. Cl.
*H04N 3/14* (2006.01)
*H04N 5/335* (2011.01)

(52) U.S. Cl.
USPC ............................. 348/308; 348/294; 348/302

(58) Field of Classification Search
USPC .................................................. 348/294–324
See application file for complete search history.

(56) References Cited

U.S. PATENT DOCUMENTS

| | | | |
|---|---|---|---|
| 7,015,739 B2 * | 3/2006 | Lee et al. ...................... | 327/175 |
| 7,199,634 B2 * | 4/2007 | Cho et al. ..................... | 327/175 |
| 7,787,037 B2 | 8/2010 | Ono et al. ..................... | 348/296 |
| 7,817,199 B2 | 10/2010 | Yamashita et al. ............ | 348/308 |
| 7,986,353 B2 | 7/2011 | Ono ............................... | 348/241 |
| 8,085,319 B2 | 12/2011 | Ono et al. ..................... | 348/241 |
| 8,362,818 B2 * | 1/2013 | Suzuki .......................... | 327/175 |
| 2005/0174149 A1 | 8/2005 | Hu | |
| 2005/0184780 A1 * | 8/2005 | Chun ............................. | 327/175 |
| 2005/0231255 A1 | 10/2005 | Choi et al. | |
| 2005/0231624 A1 * | 10/2005 | Muramatsu et al. .......... | 348/311 |
| 2006/0012696 A1 | 1/2006 | Zarnowski et al. | |
| 2010/0194949 A1 | 8/2010 | Hisamatsu | |
| 2011/0285441 A1 * | 11/2011 | Suzuki .......................... | 327/175 |
| 2011/0298955 A1 * | 12/2011 | Horimoto et al. ............. | 348/308 |

FOREIGN PATENT DOCUMENTS

EP  1 699 135 A2  9/2006
JP  2009-089066 A  4/2009

OTHER PUBLICATIONS

European Search Report in European Application No. EP 12 174 008.8 issued Oct. 4, 2013 (7 pages).

* cited by examiner

*Primary Examiner* — Timothy J Henn
*Assistant Examiner* — Pritham Prabhakher
(74) *Attorney, Agent, or Firm* — Fitzpatrick, Cella, Harper & Scinto

(57) ABSTRACT

A solid-state image sensing apparatus, comprising, a pixel portion, a conversion portion including a first group and a second group each of which includes at least one analog/digital conversion unit to convert an analog signal of the pixel portion into a digital signal, and a clock supply unit including a first clock buffer and a second clock buffer connected in series for propagation of a clock signal, wherein each of the analog/digital conversion units includes a comparison unit and a counter unit, the comparison unit compares the analog signal with a comparison reference potential, the counter unit measures a time from the start of the comparison to the change of the comparison result, each of the first clock buffer and the second clock buffer corrects a duty ratio of a clock signal by using a differential circuit.

4 Claims, 9 Drawing Sheets

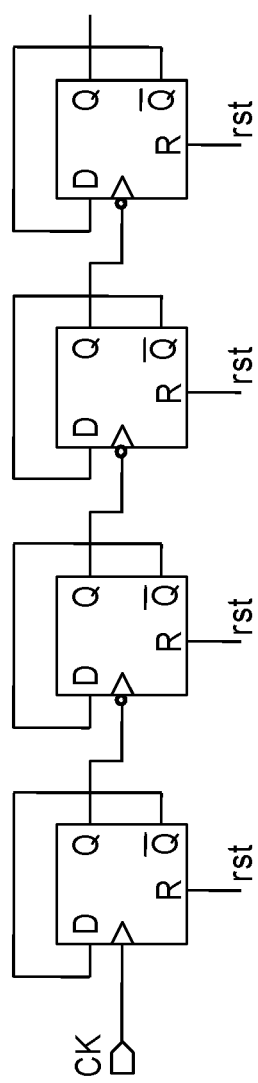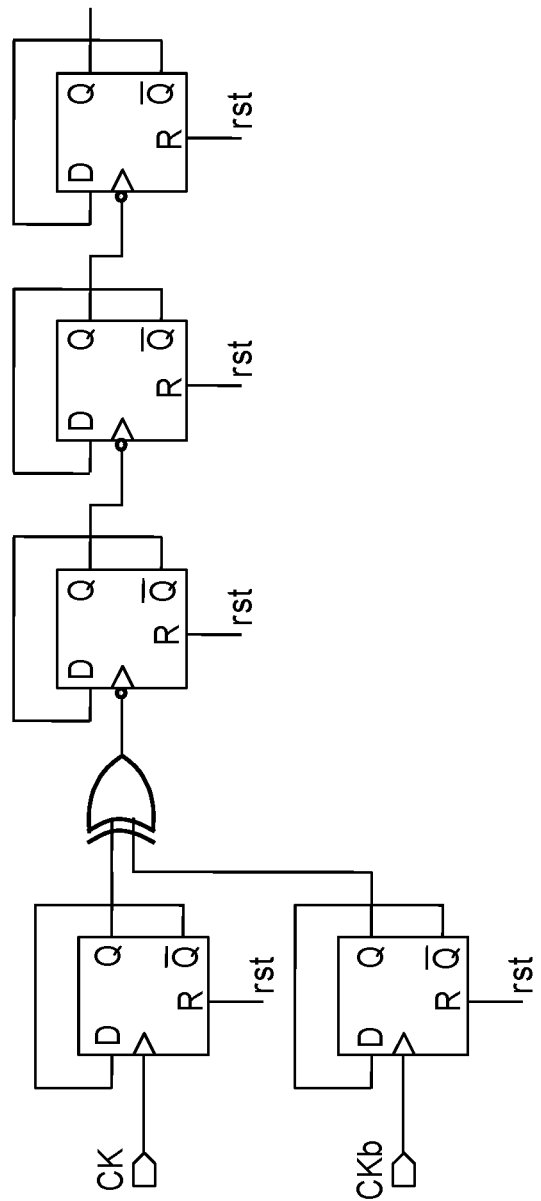
FIG. 8A
FIG. 8B

SOLID-STATE IMAGE SENSING APPARATUS

BACKGROUND OF THE INVENTION

1. Field of the Invention

The present invention relates to a solid-state image sensing apparatus.

2. Description of the Related Art

A solid-state image sensing apparatus is formed as, for example, a CMOS image sensor or CCD image sensor, and includes a pixel portion in which pixels are arranged in an array form and analog/digital conversion units which convert analog signals output from the pixel portion into digital signals. The analog/digital conversion units include comparison units which compare analog signals with comparison reference voltages and output the determination results and counter units each of which counts a clock signal to measure the time required from the instant comparison starts to the instant a determination result changes. It is possible to use a plurality of buffers to supply clock signals with uncollapsed waveforms to the counters of the counter units. An increase in the number of pixels leads to an increase in the number of counter units, and an increase in the length of a clock wiring for the propagation of a clock signal, which accompanies an increase in parasitic capacitance component/parasitic resistance component. This requires more buffers.

The use of a large number of buffers can cause a perturbation in the duty ratio (High period/signal cycle) of a clock signal due to manufacturing variation, in particular. Japanese Patent Laid-Open No. 2009-89066 discloses a circuit which counts each clock signal at its two edges. According to this literature, this circuit suppresses a perturbation in the duty ratio of counting operation.

An increase in the number of buffers with an increase in the number of pixels and manufacturing variation accompanying miniaturizing can cause a problem in terms of a perturbation in the duty ratio of a clock signal. According to patent literature 1, the disclosed technique suppresses a perturbation in the duty ratio of counting operation. However, this literature does not disclose any technique of suppressing a perturbation in the duty ratio of a clock signal itself.

SUMMARY OF THE INVENTION

The present invention provides a technique which is advantageous for suppressing a perturbation in the duty ratio of a clock signal supplied to each counter unit regardless of manufacturing variation.

One of the aspects of the present invention provides a solid-state image sensing apparatus, comprising, a pixel portion which includes a plurality of pixels arranged in an array form, a conversion portion which includes a first group including at least one analog/digital conversion unit which converts an analog signal output from the pixel portion into a digital signal and a second group including at least one analog/digital conversion unit, and a clock supply unit which includes a first clock buffer and a second clock buffer connected in series to each other for propagation of a clock signal, wherein each of the analog/digital conversion units of the first group and the second group includes a comparison unit and a counter unit, the comparison unit compares the analog signal with a comparison reference potential which changes with time and outputs a result, the counter unit counts a clock signal supplied from the clock supply unit, the first clock buffer corrects a duty ratio of a clock signal by using a differential circuit and outputs the clock signal to each of the counter units of the first group and the second clock buffer via CMOS inverter circuits on even-numbered stages, and the second clock buffer corrects a duty ratio of a clock signal supplied from the first clock buffer by using a differential circuit and outputs the clock signal to each of the counter units of the second group via CMOS inverter circuits on even-numbered stages.

Further features of the present invention will become apparent from the following description of exemplary embodiments with reference to the attached drawings.

BRIEF DESCRIPTION OF THE DRAWINGS

FIG. 8A is a circuit diagram showing counters which can be used for the counter units of the solid-state image sensing apparatus of the present invention; and FIG. 8B is a circuit diagram showing counters which can be used for the counter units of the solid-state image sensing apparatus of the present invention.

DESCRIPTION OF THE EMBODIMENTS

Figure 1:
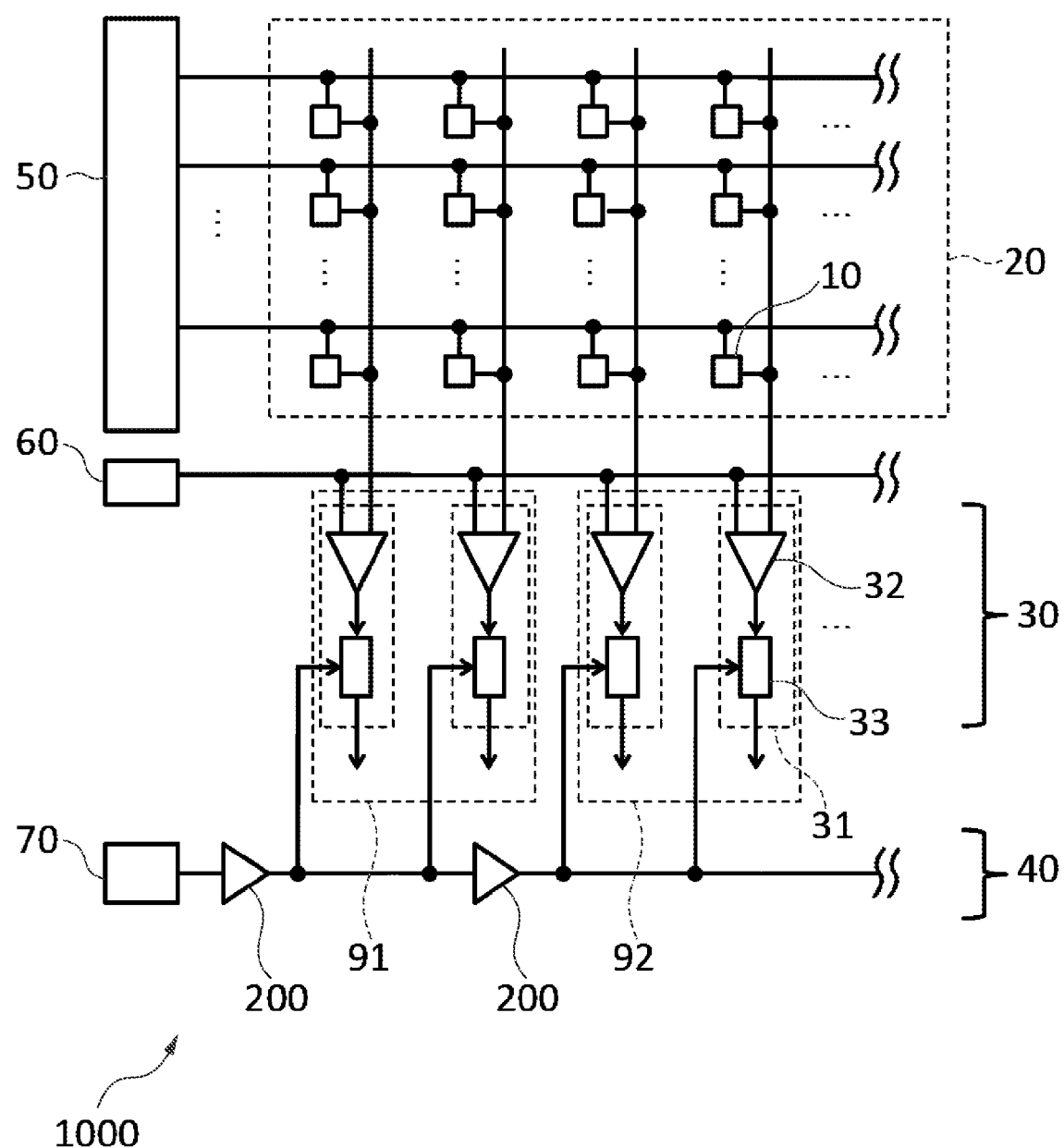
FIG. 1 is a circuit diagram showing an example of a solid-state image sensing apparatus to explain a conventional clock signal transmission scheme.

Problems in the conventional clock signal transmission scheme will be described in detail first. FIG. 1 shows a solid-state image sensing apparatus 1000 using the conventional clock signal transmission scheme. The solid-state image sensing apparatus 1000 includes, for example, a pixel portion 20 in which a plurality of pixels 10 are arranged in an array form, a conversion portion 30 having a plurality of analog/digital conversion units 31, and a clock supply unit 40 having a plurality of buffers 200 connected in series to each other for the propagation of a clock signal. In addition, this apparatus can be provided with, as peripheral circuits, a horizontal scanning circuit 50, a comparison reference potential generator 60 which generates a comparison reference potential (for example, a ramp signal), and a clock generator 70 which generates a clock signal. Each analog/digital conversion unit 31 includes a comparison unit 32 and a counter unit 33, and converts an analog signal output from the pixel portion 20 into a digital signal. The comparison unit 32 compares an analog signal with a comparison reference potential which changes with time, and outputs the result. The counter unit 33 measures the time from the instant the comparison unit 32 starts performing comparison to the instant the comparison result changes by counting a clock signal supplied from the clock supply unit 40. Each buffer 200 buffers a propagating clock signal and outputs it to a corresponding counter unit 33 and the buffer 200 on the subsequent stage.

As shown in FIG. 1, the conventional clock signal transmission scheme uses the buffers 200 to supply clock signals with uncollapsed waveforms to the counter units 33. An increase in the number of counter units 33 due to an increase in the number of pixels leads to an increase in capacitance component. In addition, an increase in the length of a clock wiring for the propagation of a clock signal accompanies an increase in parasitic capacitance component/parasitic resistance component. This requires more buffers 200. However, an increase in the number of buffers 200 can cause a perturbation in the duty ratio of a clock signal due to an increase in manufacturing variation accompanying miniaturization.

More specifically, consider, for example, that the relationship between a driving current IDP of a PMOS and a driving current IDN of an NMOS is represented by IDP>IDN due to manufacturing variation. In this case, a threshold voltage Vt of the buffer 200 increases. With this operation, the High period of a clock signal after buffering becomes shorter than that of the clock signal before buffering. The clock signal after buffering undergoes a perturbation in waveform due to parasitic capacitance and parasitic resistance caused by long clock wirings and the input capacitances of many counter units. However, since the threshold voltage Vt of the buffer 200 has increased, buffering on the subsequent stage further shortens the High period. Repeating this operation will cause a perturbation in the duty ratio of the clock signal every time it passes through the buffer 200. As a result, the duty ratio of the clock signal at an end of the clock supply unit 40 has been greatly perturbed as compared with the initial clock signal. This can eliminate the High period of the clock signal. As a result, the signal can have only a Low state (the rectangular waveform of the clock signal itself can disappear). The present invention is configured to keep the duty ratio of a clock signal constant by using a differential circuit so as to prevent a perturbation in duty ratio. The embodiments of the present invention will be described below with reference to the accompanying drawings.

<First Embodiment>

Figure 2A:
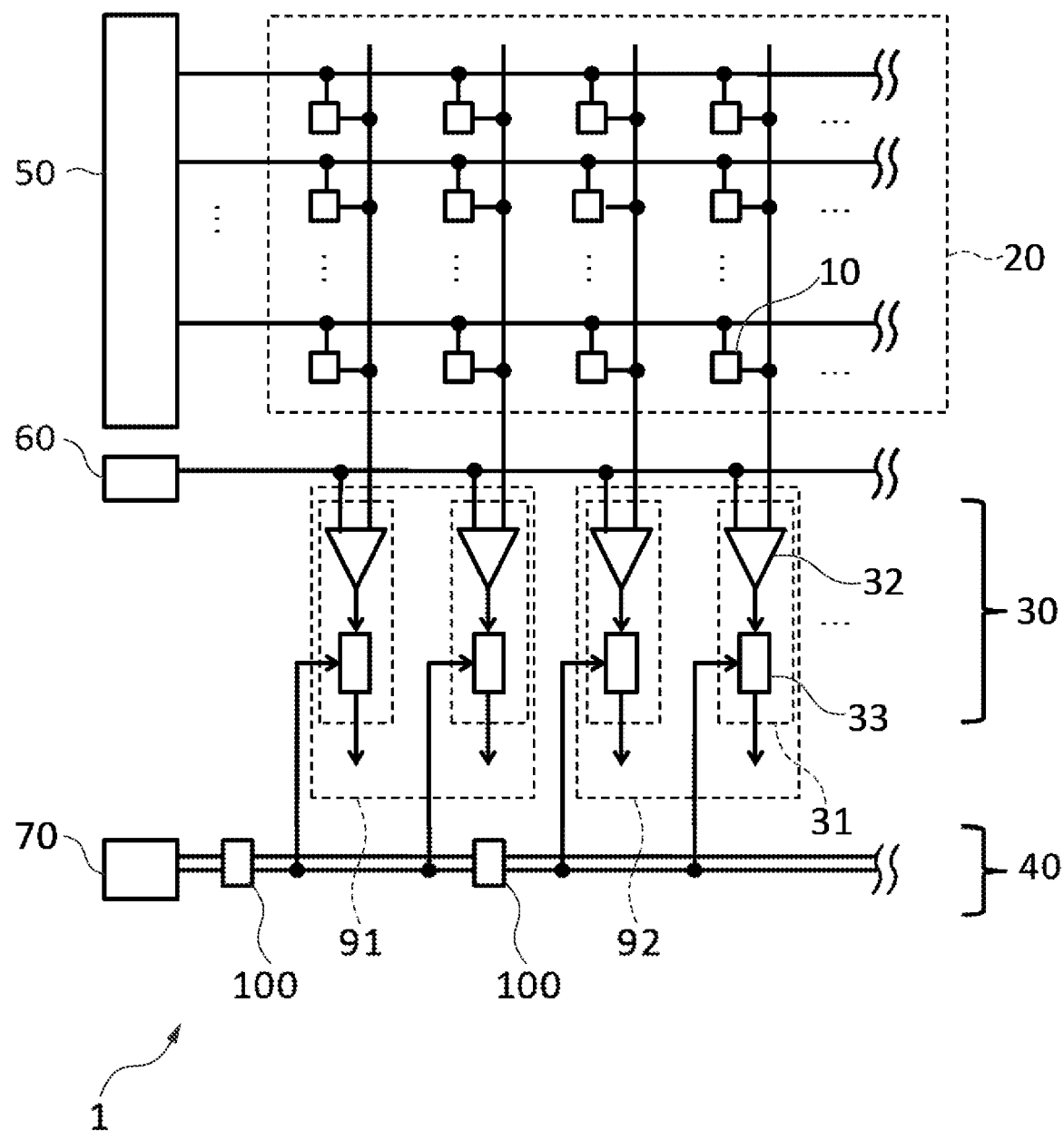
FIG. 2A is a circuit diagram showing an example of a solid-state image sensing apparatus to explain the present invention.
Figure 3:
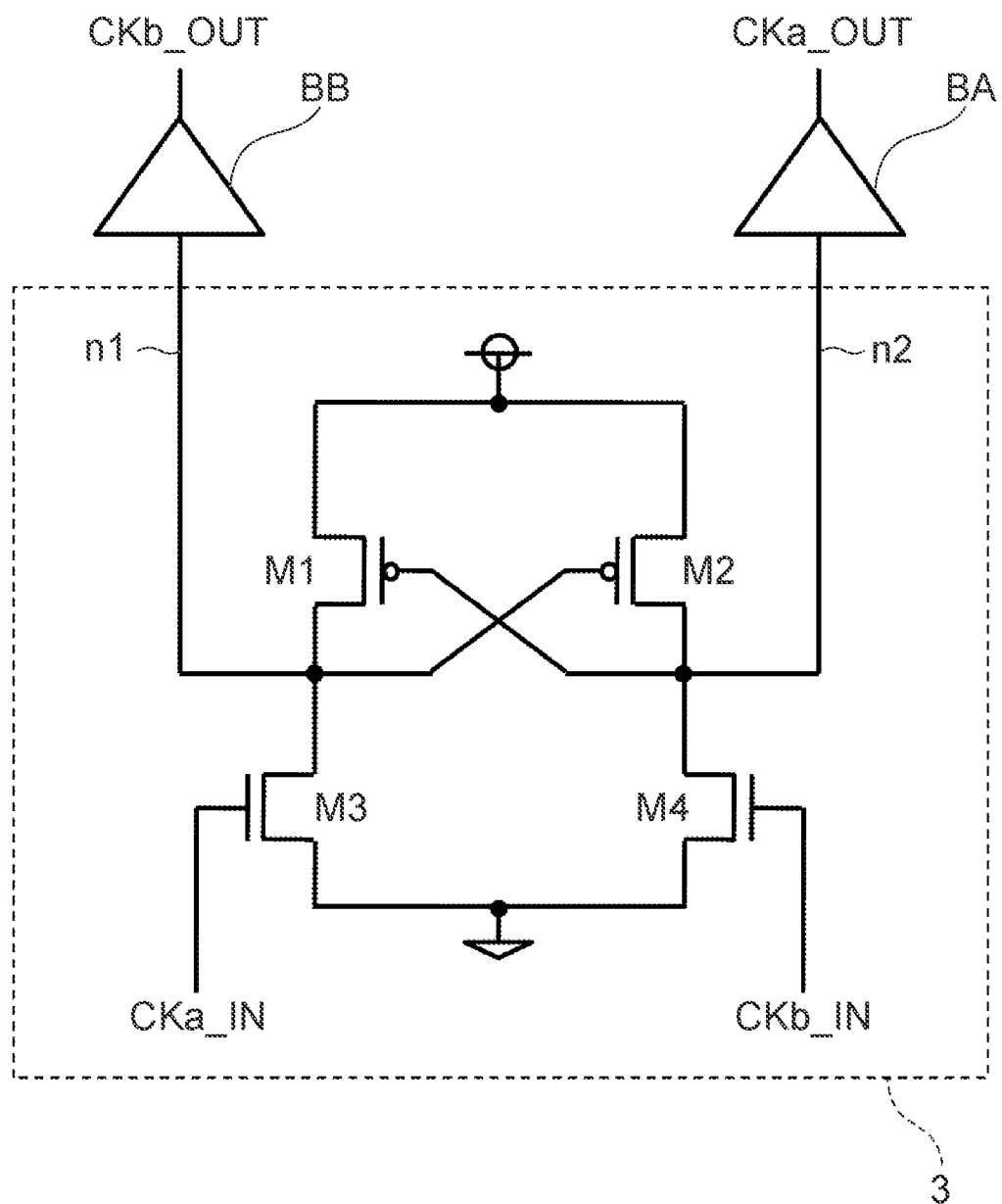
FIG. 3 is a circuit diagram of a differential circuit.

A solid-state image sensing apparatus 1 according to the first embodiment of the present invention will be described with reference to FIG. 2A. The solid-state image sensing apparatus 1 includes a pixel portion 20 in which a plurality of pixels 10 are arranged in an array form, a conversion portion 30 which converts an analog signal output from the pixel portion 20 into a digital signal, and a clock supply unit 40 which supplies a clock signal to each counter unit 33 (to be described later). The conversion portion 30 includes a first group 91 including at least one analog/digital conversion unit 31 and a second group 92 including at least one analog/digital conversion unit 31. This embodiment exemplifies the two groups, namely the first group 91 and the second group 92. However, the conversion portion 30 may further include other groups including the analog/digital conversion units 31. The clock supply unit 40 includes first and second clock buffers 100 connected in series to each other for the propagation of a clock signal. Each analog/digital conversion unit 31 of the first group 91 and each analog/digital conversion unit 31 of the second group 92 respectively include comparison units 32 and counter units 33. The comparison unit 32 compares an analog signal with a comparison reference potential (for example, a ramp signal) which changes with time, and outputs the result. The counter unit 33 measures the time from the instant the comparison unit 32 starts performing comparison to the instant the comparison result changes by counting a clock signal. Each clock buffer 100 includes a differential circuit 3 like that shown in FIG. 3.

The first clock buffer 100 corrects the duty ratio of a clock signal by using the differential circuit 3, and outputs the corrected clock signal to the counter units 33 of the first group 91 and the second clock buffer 100 via CMOS inverter circuits on the even-numbered stages. The second clock buffer 100 corrects the duty ratio of a clock signal by using the differential circuit 3, and outputs the corrected clock signal to the counter units 33 of the second group 92 via the CMOS inverter circuits on the even-numbered stages. This can provide the solid-state image sensing apparatus 1 which can prevent the duty ratio of a clock signal from being perturbed by buffering, that is, can prevent the rectangular waveform of the clock signal itself from disappearing.

As the counter unit 33 of the solid-state image sensing apparatus 1, in particular, a ripple counter 33$a$ shown in FIG. 8A is used sometimes. The counter 33$a$ performs counting operation using a leading edge of a clock signal, and hence a perturbation in the duty ratio of a clock signal poses no problem as long as the clock signal has a constant period. As described above, however, as buffering is repeated, a perturbation in the duty ratio of a clock signal becomes worse, and the rectangular waveform of the clock signal sometimes disappears in the end. Applying the present invention to this technique can correct the duty ratio of a clock signal for each buffering so as to make it have a constant duty ratio. This can prevent the rectangular waveform of the clock signal from disappearing before the signal reaches an end of the clock supply unit 40.

As described above, this embodiment can correct the duty ratio of a clock signal for each buffering, and can keep the duty ratio of the clock signal constant up to an end of the clock supply unit 40.

The differential circuit 3 includes PMOS transistors M1 (first transistor) and M2 (second transistor) and NMOS transistors M3 (third transistor) and M4 (fourth transistor) between the power supply potential and the reference potential. The two outputs of the differential circuit 3 can be respectively connected to buffers BA and BB formed from CMOS inverters on even-numbered stages. The transistor M1 is connected in series to the transistor M3. The transistor M2 is connected in series to the transistor M4. A connection point n1 (first node) between the transistor M1 and the transistor M3 is electrically connected to the gate of the transistor M2. A connection point n2 (second node) between the transistor M2 and the transistor M4 is electrically connected to the gate of the transistor M1. The gate of the transistor M3 serves as the first input terminal of the differential circuit 3 and receives a clock signal CKa_IN. The gate of the transistor M4 serves as the second input terminal of the differential circuit 3, and receives a clock signal CKb_IN having an opposite phase to the signal CKa_IN. The connection point n2 is connected to the input of the buffer BA. The connection point n1 is connected to the input of the buffer BB. The buffer BA outputs a signal CKa_OUT. The buffer BB outputs a signal CKb_OUT. In this case, the transistors M3 and M4 are sufficiently larger in size than the transistors M1 and M2. Assume that the transistors M3 and M4 have driving powers larger than those of the transistors M1 and M2 even with manufacturing variation or under any conditions including operating voltage conditions and operating temperature conditions.

Figure 4:
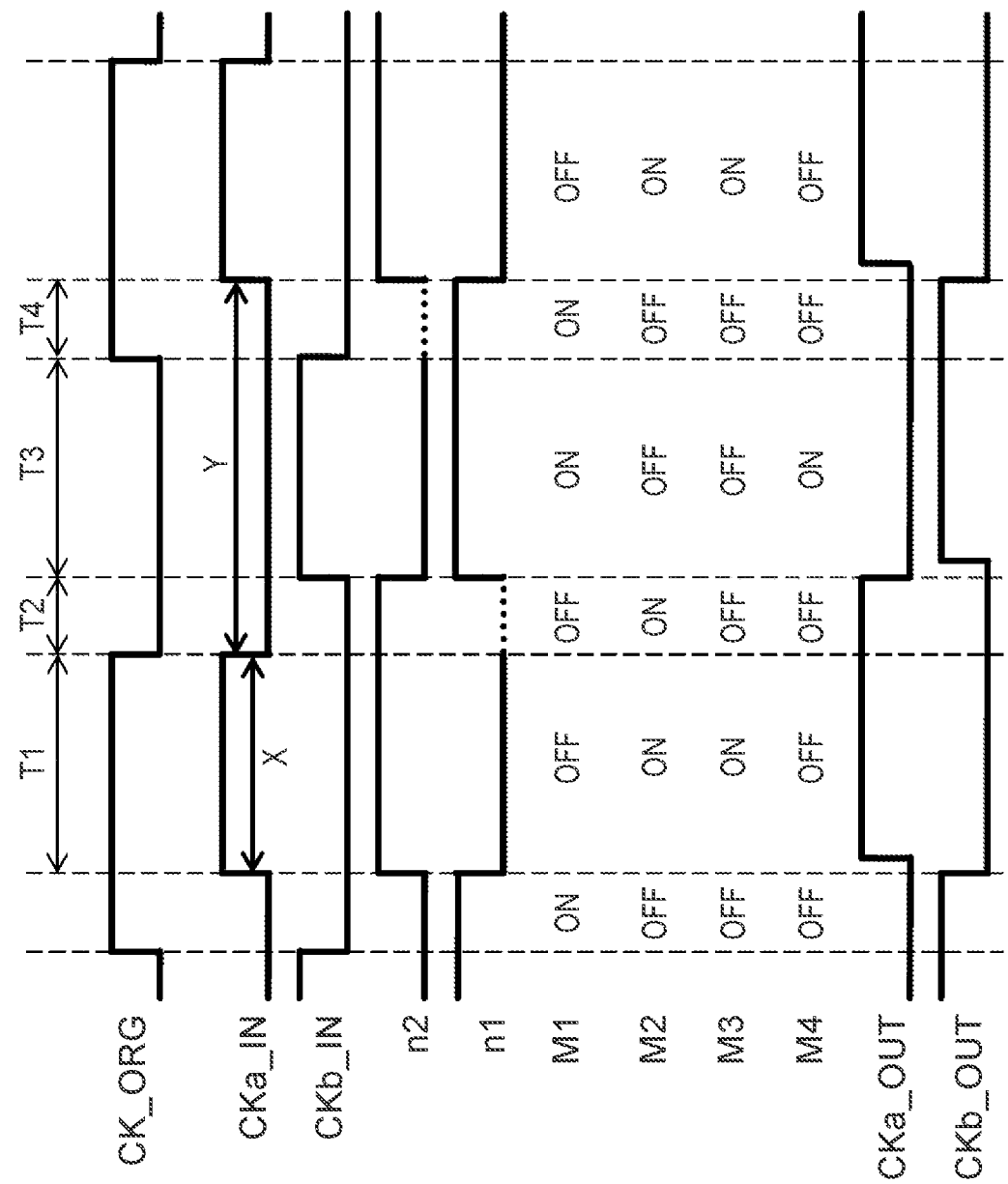
FIG. 4 is a timing chart of the differential circuit.

Consider the first case in which a buffer designed to have a threshold voltage Vt as a central voltage is influenced by manufacturing variation such that the PMOS driving power becomes larger than the NMOS driving power, and the voltage Vt becomes higher than the design value. That is, in the first case, the differential circuit 3 receives a clock signal whose High period is shortened by buffering. FIG. 4 is a timing chart showing the voltages at the respective nodes and the states of the respective transistors when the duty ratio of the input CKa_IN is X/(X+Y) (where X<Y).

In an interval T1, since the signal CKa_IN is in a High state and the signal CKb_IN is in a Low state, the transistor M3 is set in an ON state, and the connection point n1 is set in the Low state. Therefore, the transistor M2 is set in the ON state and the transistor M4 is set in an OFF state. As a consequence, the connection point n2 is set in the High state, and the transistor M1 is set in the OFF state.

Subsequently, in an interval T2, since the signal CKa_IN is in the Low state and the signal CKb_IN is in the Low state, the transistor M3 is set in the OFF state, and the transistor M1 is kept in the OFF state. Therefore, the connection point n1 is maintained in the Low state. This keeps the transistor M2 in the ON state, and the transistor M4 is in the OFF state. As a consequence, the connection point n2 is set in the High state.

In an interval T3, since the signal CKa_IN is in the Low state and the signal CKb_IN is in the High state, the transistor M4 is set in the ON state, and the connection point n2 is set in the Low state. Therefore, the transistor M1 is set in the ON state, and the transistor M3 is in the OFF state. As a consequence, the connection point n1 is set in the High state, and the transistor M2 is set in the OFF state.

In an interval T4, since the signal CKa_IN is in the Low state and the signal CKb_IN is in the Low state, the transistor M4 is set in the OFF state, and the transistor M2 remains in the OFF state. This maintains the connection point n2 in the Low state. This also maintains the transistor M1 in the ON state. Since the transistor M3 is in the OFF state, the connection point n1 is set in the High state.

In the first case, the duty ratio of the clock signal is perturbed into $X/(X+Y)$ (where $X<Y$) due to buffering as a result of repetition of the operation in intervals T1 to T4. The duty ratio is recovered to 50% and corrected at the connection points n1 and n2 in the differential circuit 3.

Figure 5:
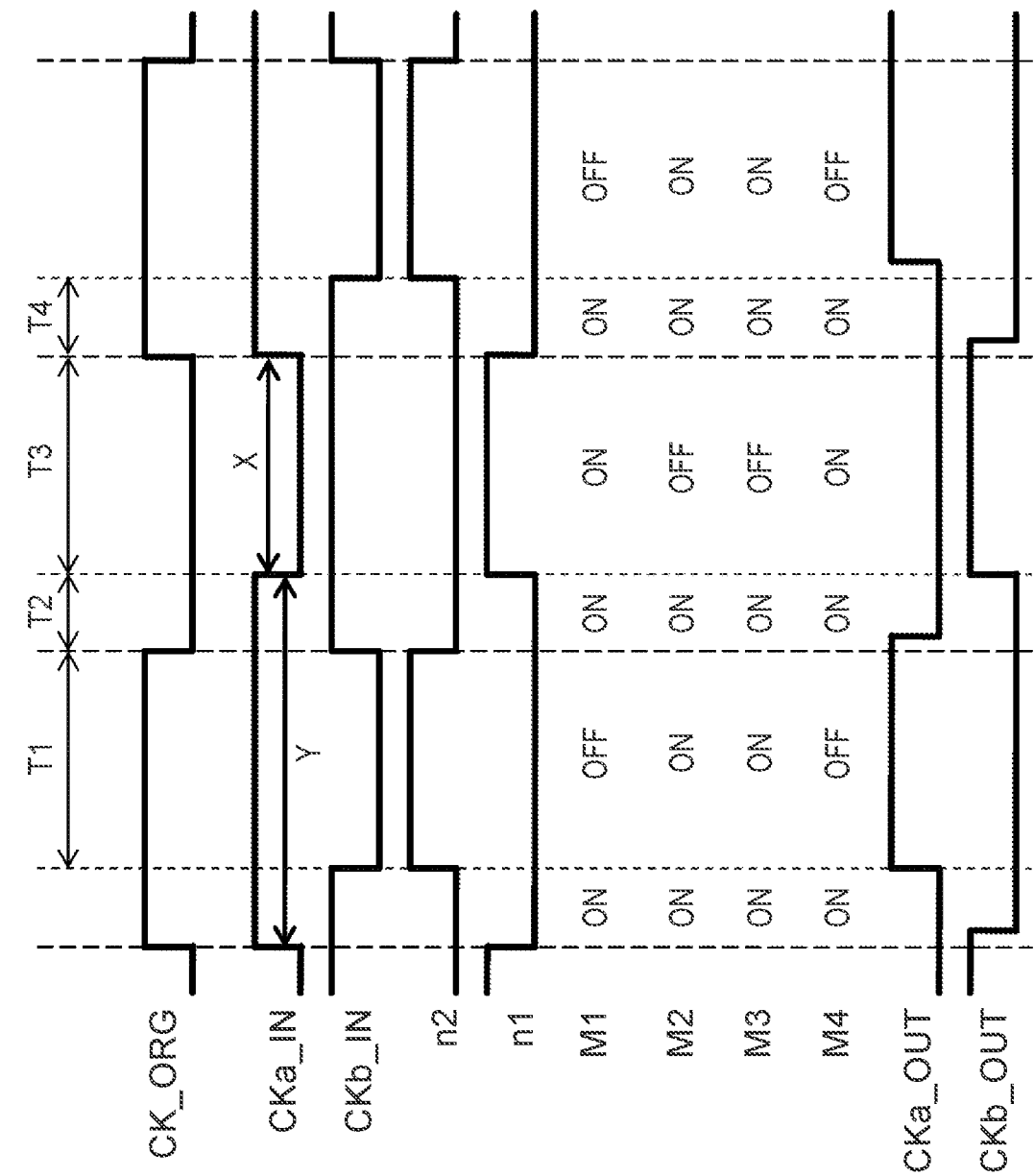
FIG. 5 is a timing chart of the differential circuit.

Next, consider the second case in which a buffer designed to have the threshold voltage Vt as a central voltage is influenced by manufacturing variation such that the NMOS driving power becomes larger than the PMOS driving power, and the voltage Vt becomes lower than the design value. That is, in the second case, the differential circuit 3 receives a clock signal whose High period is elongated by buffering. FIG. 5 is a timing chart showing the voltages at the respective nodes and the states of the respective transistors when the duty ratio of the input CKa_IN is $Y/(X+Y)$ (where $X<Y$).

In an interval T1, since the signal CKa_IN is in the High state and the signal CKb_IN is in the Low state, the transistor M3 is set in the ON state, and the connection point n1 is set in the Low state. Therefore, the transistor M2 is set in the ON state and the transistor M4 is set in the OFF state. As a consequence, the connection point n2 is set in the High state, and the transistor M1 is set in the OFF state.

Subsequently, in an interval T2, since the signal CKa_IN is in the High state and the signal CKb_IN is in the High state, the transistor M4 is set in the ON state, and the transistor M2 is kept in the ON state. However, since the transistor M4 has larger driving power than the transistor M2, the connection point n2 is set in the Low state. This sets the transistor M1 in the ON state. Although the transistor M3 is also in the ON state, the connection point n1 is set in the Low state for the same reason.

In an interval T3, since the signal CKa_IN is in the Low state and the signal CKb_IN is in the High state, the transistor M4 is set in the ON state, and the connection point n2 is set in the Low state. Therefore, the transistor M1 is set in the ON state, and the transistor M3 is in the OFF state. As a consequence, the connection point n1 is set in the High state, and the transistor M2 is set in the OFF state.

In an interval T4, since the signal CKa_IN is in the High state and the signal CKb_IN is in the High state, the transistor M3 remains in the ON state. At this time, the transistor M1 also remains in the ON state. However, since the transistor M3 has larger driving power than the transistor M1, the connection point n1 is set in the Low state. This sets the transistor M2 in the ON state. Although the transistor M4 is also in the ON state, the connection point n2 is set in the Low state for the same reason.

The operation in the intervals T1 to T4 is repeated. In the second case, when the signal whose duty ratio has been perturbed into $Y/(X+Y)$ (where $X<Y$) due to buffering is input to the differential circuit 3, the duty ratio is inverted to $X/(X+Y)$ at the connection points n1 and n2. Thereafter, the buffer BA (or the buffer BB) buffers this clock signal whose duty ratio has been inverted. As a consequence, the High period is elongated, and the duty ratio is restored and corrected. That is, the differential circuit 3 corrects the perturbation in duty ratio, and prevents the rectangular waveform of the clock signal from disappearing.

In summary, in the first case, the differential circuit 3 restores and corrects the duty ratio of a clock signal, which has been perturbed, to 50%. In the second case, the differential circuit 3 inverts the duty ratio, and the subsequent buffer BA (or the buffer BB) corrects the duty ratio. Therefore, the present invention can obtain the effects described above.

<Second Embodiment>

Figure 6:
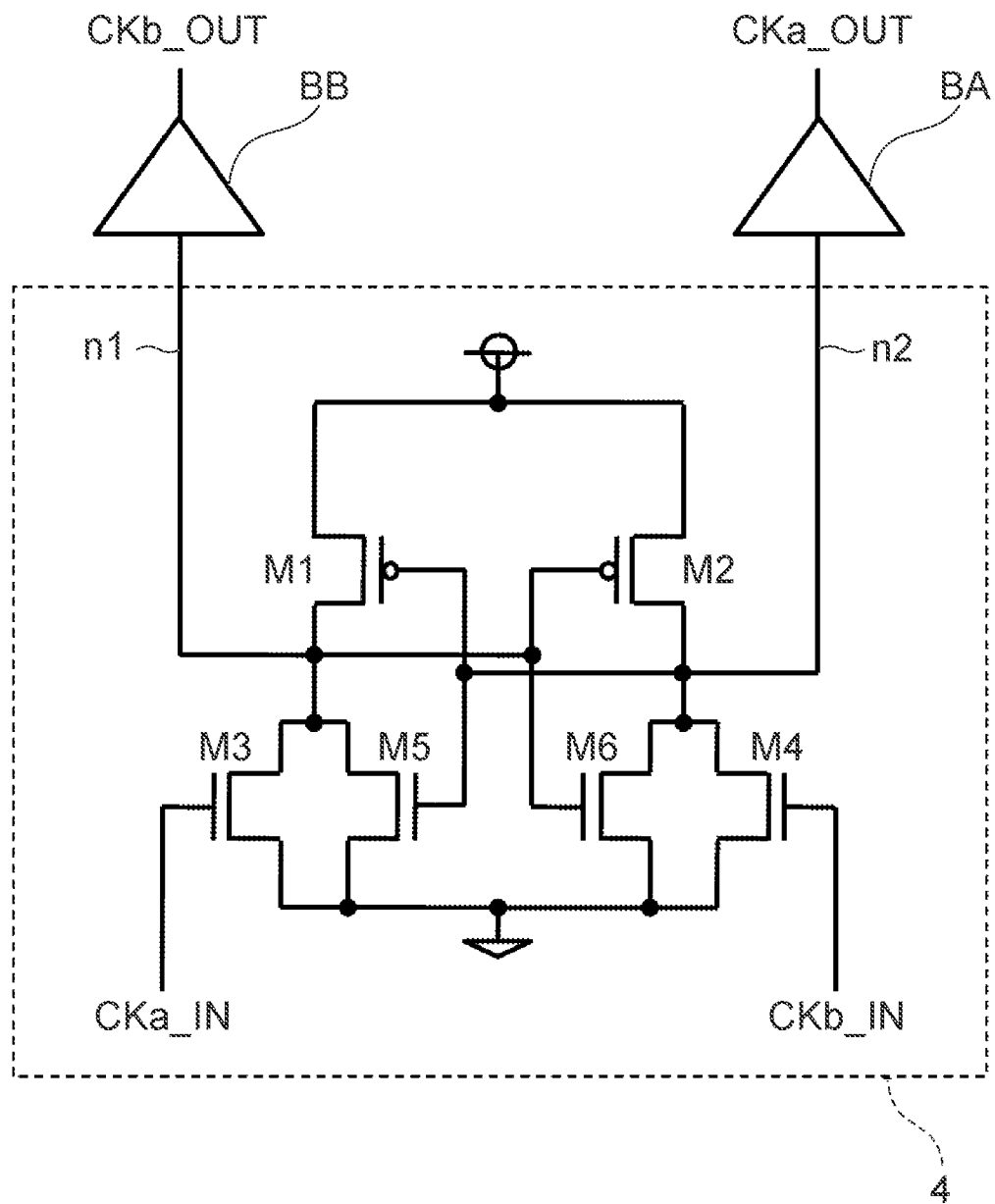
FIG. 6 is a circuit diagram of the differential circuit.

The second embodiment of the present invention will be described. The second embodiment differs from the first embodiment in that a differential circuit 4 shown in FIG. 6 is used as a clock buffer 100. The differential circuit 4 includes an NMOS transistor M5 (fifth transistor) and an NMOS transistor M6 (sixth transistor) in addition to the circuit arrangement of the differential circuit 3. The transistor M5 is placed in parallel to a transistor M3. The gate of the transistor M5 is connected to a connection point n2. The transistor M6 is placed in parallel to a transistor M4. The gate of the transistor M6 is connected to a connection point n1. Using the differential circuit 3 shown in FIG. 3 poses the problem that the connection points n1 and n2 are set in a floating state in the intervals T2 and T4 in the first case (FIG. 4) described above. Using the differential circuit 4 as the clock buffer 100 will solve this problem and provide a solid-state image sensing apparatus 1 with higher reliability.

Figure 7:
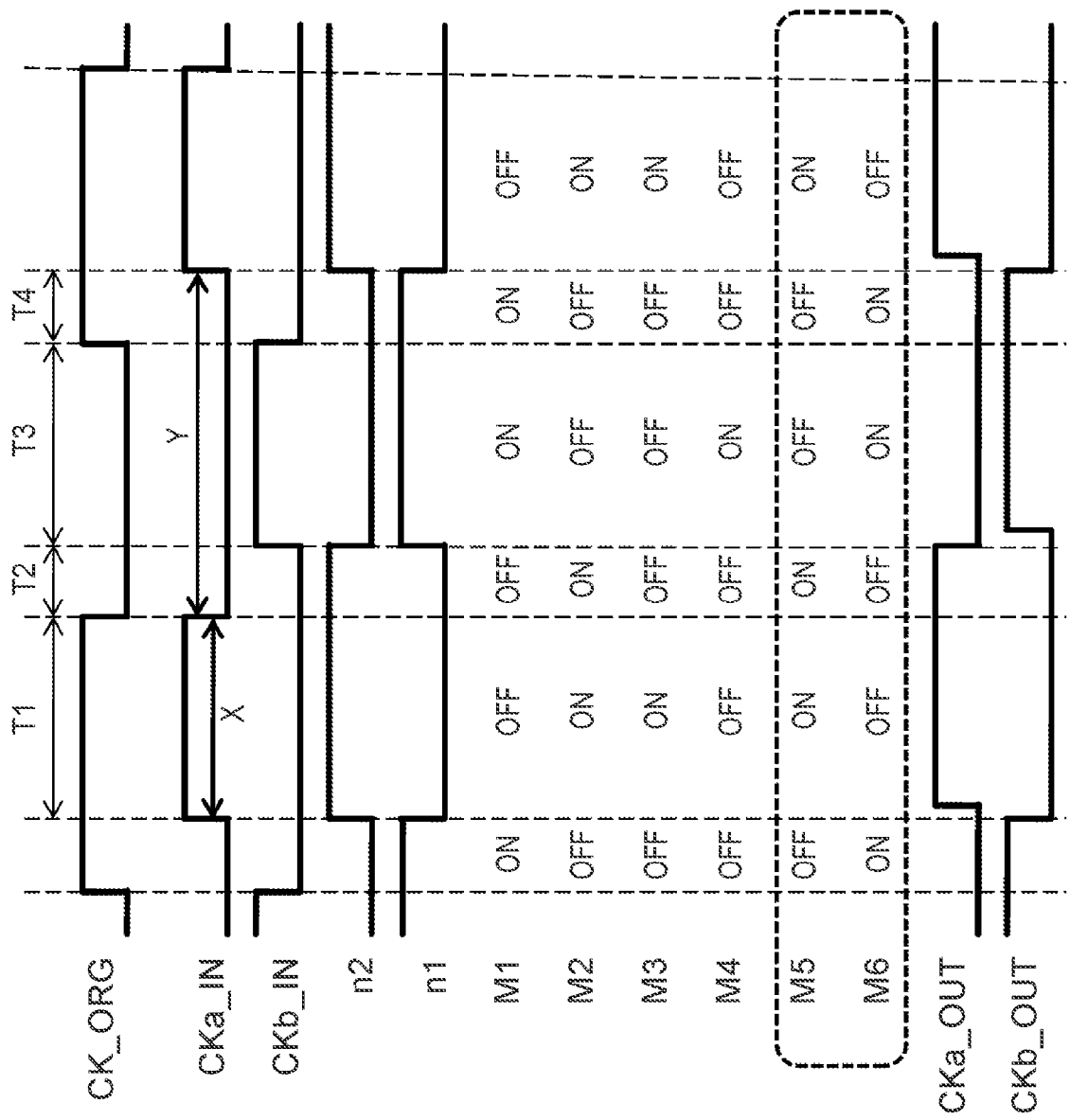
FIG. 7 is a timing chart of the differential circuit.

FIG. 7 is a timing chart showing the voltages at the respective nodes and the states of the respective transistors in the differential circuit 4 in the first case described above, that is, when the duty ratio of an input CKa_IN is $X/(X+Y)$ (where $X<Y$). That is, FIG. 7 is a timing chart which additionally shows the states of the transistors M5 and M6 in each interval in FIG. 4. The state of the transistor M5 is inverse to that of a transistor M1, and the state of the transistor M6 is inverse to that of a transistor M2. Using the differential circuit 4 therefore will prevent the connection points n1 and n2 from being set in a floating state, owing to the complementary action of the transistors M5 and M6, and can provide a solid-state image sensing apparatus 1 with higher reliability.

>Third Embodiment≤

Figure 2B:
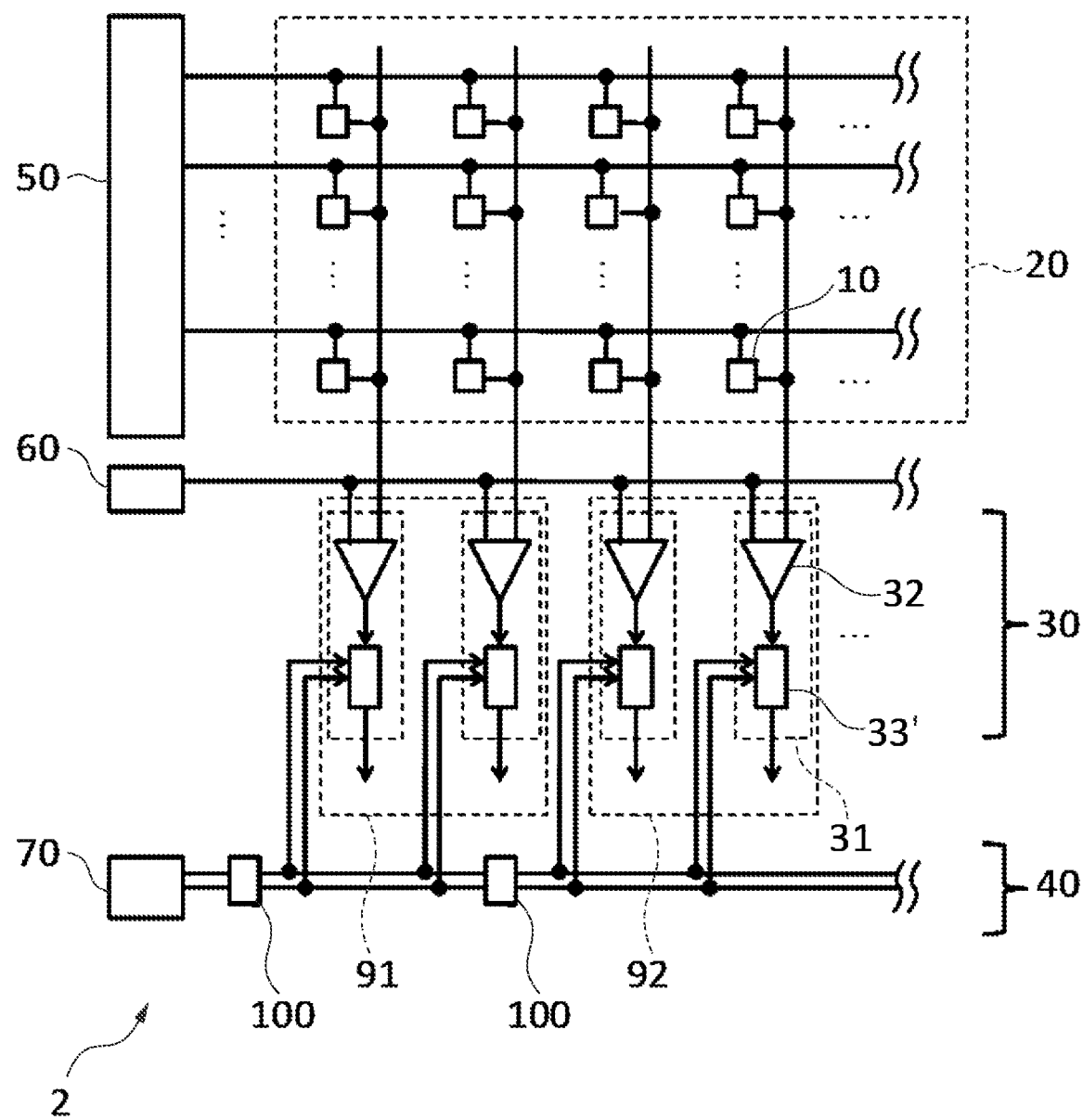
FIG. 2B is a circuit diagram showing an example of a solid-state image sensing apparatus to explain the present invention.

A solid-state image sensing apparatus 2 according to the third embodiment of the present invention will be described with reference to FIG. 2B. The third embodiment differs from the first embodiment in that a clock buffer 100 uses both differential clock signals. For example, it is possible to form a counter unit 33' by using a ripple counter 33a' shown in FIG. 8B. The counter 33a' performs counting operation at a leading edge of the waveform of a signal CKa_OUT and a leading edge of the waveform of a signal CKb_OUT indicated by a timing chart (for example, FIG. 4 or 5). That is, this counter operates at two edges, namely leading and trailing edges of the signal CKa_OUT. It is therefore necessary to prevent the duty ratio of each clock signal from being perturbed by buffering. Applying the present invention to this technique can keep the duty ratio of a clock signal constant up to an end of a clock supply unit 40.

The three embodiments have been described above. Obviously, it is possible to modify the present invention in accordance with other specification requirements.

The following will exemplify the camera incorporating the solid-state image sensing apparatus according to each embodiment described above as an example of an application of the solid-state image sensing apparatus. The concept of a camera includes not only an apparatus primarily aiming at imaging but also an apparatus secondarily having an imaging function (for example, a personal computer or portable terminal). A camera includes a solid-state image sensing apparatus according to the present invention, which has been exemplified as the above embodiments, and a processing unit which processes signals output from the solid-state image sensing apparatus. The processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-154265, filed Jul. 12, 2011, which is hereby incorporated by reference herein in its entirety.

What is claimed is:

1. A solid-state image sensing apparatus, comprising:
a pixel portion which includes a plurality of pixels arranged in an array form;
a conversion portion which includes a first group and a second group, each of which includes at least one analog/digital conversion unit which converts an analog signal output from said pixel portion into a digital signal; and
a clock supply unit which includes a first clock buffer and a second clock buffer which are connected in series to each other for propagation of a clock signal,
wherein each of the analog/digital conversion units of the first group and the second group includes a comparison unit and a counter unit,
the comparison unit compares the analog signal with a comparison reference potential which changes with time and outputs a result,
the counter unit counts the clock signal supplied from the clock supply unit,
the first clock buffer corrects a duty ratio of the clock signal by using a first differential circuit and outputs a first corrected clock signal, whose duty ratio is corrected by the first differential circuit, to each of the counter units of the first group and the second clock buffer, via an even-number of CMOS inverter circuits connected in series,
the second clock buffer corrects a duty ratio of the first corrected clock signal supplied from the first clock buffer by using a second differential circuit, and outputs a second corrected clock signal, whose duty ratio is corrected by the second differential circuit, to each of the counter units of the second group, via an even-number of CMOS inverter circuits connected in series.

2. The apparatus according to claim 1, wherein the first and second differential circuits include a first node, a second node, a first transistor, a second transistor, a third transistor, and a fourth transistor between a power supply potential and a reference potential,
the first transistor comprises a PMOS transistor and is placed between the power supply potential and the first node,
a gate of the first transistor is electrically connected to the second node,
the second transistor comprises a PMOS transistor and is placed between the power supply potential and the second node,
a gate of the second transistor is electrically connected to the first node,
the third transistor comprises an NMOS transistor and is placed between the first node and the reference potential, and
the fourth transistor comprises an NMOS transistor and is placed between the second node and the reference potential.

3. The apparatus according to claim 1, wherein the first and second differential circuits include a first node, a second node, a first transistor, a second transistor, a third transistor, a fourth transistor, a fifth transistor, and a sixth transistor between a power supply potential and a reference potential,
the first transistor comprises a PMOS transistor and is placed between the power supply potential and the first node,
a gate of the first transistor is electrically connected to the second node,
the second transistor comprises a PMOS transistor and is placed between the power supply potential and the second node,
a gate of the second transistor is electrically connected to the first node,
the third transistor comprises an NMOS transistor and is placed between the first node and the reference potential,
the fourth transistor comprises an NMOS transistor and is placed between the second node and the reference potential,
the fifth transistor comprises an NMOS transistor and is placed between the first node and the reference potential,
a gate of the fifth transistor is electrically connected to the second node,
the sixth transistor comprises an NMOS transistor and is placed between the second node and the reference potential, and
a gate of the sixth transistor is electrically connected to the first node.

4. The apparatus according to claim 1, wherein the first clock buffer corrects a duty ratio of a signal having an opposite phase to the clock signal by using the first differential circuit, and outputs a first corrected signal, whose duty ratio is corrected by the first differential circuit, to each of the counter units of the first group and the second clock buffer, via an even-number of CMOS inverter circuits connected in series, and
the second clock buffer corrects a duty ratio of the first corrected signal having an opposite phase to the first corrected clock signal supplied from the first clock buffer by using the second differential circuit, and outputs a second corrected signal, whose duty ratio is corrected by the second differential circuit, to each of the counter units of the second group, via an even-number of CMOS inverter circuits connected in series.

* * * * *